United States Patent
Op De Beeck et al.

(10) Patent No.: US 8,590,139 B2
(45) Date of Patent: Nov. 26, 2013

(54) PATTERNING OF AND CONTACTING MAGNETIC LAYERS

(75) Inventors: Maria Op De Beeck, Leuven (BE); Liesbet Lagae, Leuven (BE); Sven Cornelissen, Bree (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 0 days.

(21) Appl. No.: 13/202,300

(22) PCT Filed: May 18, 2010

(86) PCT No.: PCT/EP2010/056785
§ 371 (c)(1),
(2), (4) Date: Aug. 18, 2011

(87) PCT Pub. No.: WO2010/133576
PCT Pub. Date: Nov. 25, 2010

(65) Prior Publication Data
US 2012/0052258 A1 Mar. 1, 2012

Related U.S. Application Data

(60) Provisional application No. 61/179,267, filed on May 18, 2009.

(51) Int. Cl.
*H04R 31/00* (2006.01)
*G11B 5/127* (2006.01)
*G11B 5/39* (2006.01)

(52) U.S. Cl.
USPC ............... 29/603.13; 29/603.15; 29/603.16; 427/128; 427/129; 451/8; 216/22

(58) Field of Classification Search
None
See application file for complete search history.

(56) References Cited

U.S. PATENT DOCUMENTS

| | | | |
|---|---|---|---|
| 7,563,723 B2 * | 7/2009 | Abatchev et al. | 438/714 |
| 2005/0127416 A1 * | 6/2005 | Han et al. | 257/293 |
| 2005/0277207 A1 | 12/2005 | Costrini et al. | |
| 2007/0166840 A1 * | 7/2007 | Assefa et al. | 438/3 |
| 2008/0003795 A1 * | 1/2008 | Kojima | 438/597 |
| 2009/0078927 A1 | 3/2009 | Xiao et al. | |

* cited by examiner

*Primary Examiner* — Kevin Bernatz
(74) *Attorney, Agent, or Firm* — Knobbe, Martens, Olson & Bear, LLP.

(57) ABSTRACT

A method according to embodiments of the present invention comprises providing a magnetic stack comprising a magnetic layer sub-stack comprising magnetic layers and a bottom conductive electrode and a top conductive electrode electrically connecting the magnetic layer sub-stack at opposite sides thereof; providing a sacrificial pillar on top of the magnetic stack, the sacrificial pillar having an undercut with respect to an overlying second sacrificial material and a sloped foot with increasing cross-sectional dimension towards the magnetic stack, using the sacrificial pillar for patterning the magnetic stack, depositing an insulating layer around the sacrificial pillar, selectively removing the sacrificial pillar, thus creating a contact hole towards the patterned magnetic stack, and filling the contact hole with electrically conductive material.

16 Claims, 8 Drawing Sheets

Prior Art

PATTERNING OF AND CONTACTING MAGNETIC LAYERS

CROSS-REFERENCE TO RELATED APPLICATIONS

This application is the national phase under 35 U.S.C. §371 of prior PCT International Application No. PCT/EP2010/056785 which has an International Filing Date of May 18, 2010, which designates the United States of America, and which claims the benefit of U.S. Provisional Application No. 61/179,267 filed on May 18, 2009, the disclosures of which are hereby expressly incorporated by reference in their entirety and are hereby expressly made a portion of this application.

FIELD OF THE INVENTION

The present invention relates to the field of patterning of magnetic layers. Furthermore, the present invention relates to the fabrication of magnetic devices.

BACKGROUND OF THE INVENTION

Figure 1A:
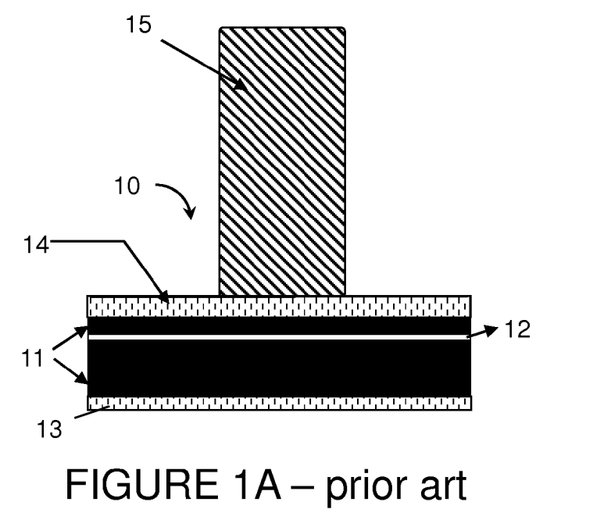
FIGS. 1A and 1B illustrate the prior art problem of sidewall re-deposition of conductive material onto crucial parts of the device after ion-milling, thereby resulting in a conductive bridge over the insulating layer between magnetic layers, and hence in a complete non-functional device.
Figure 1B:
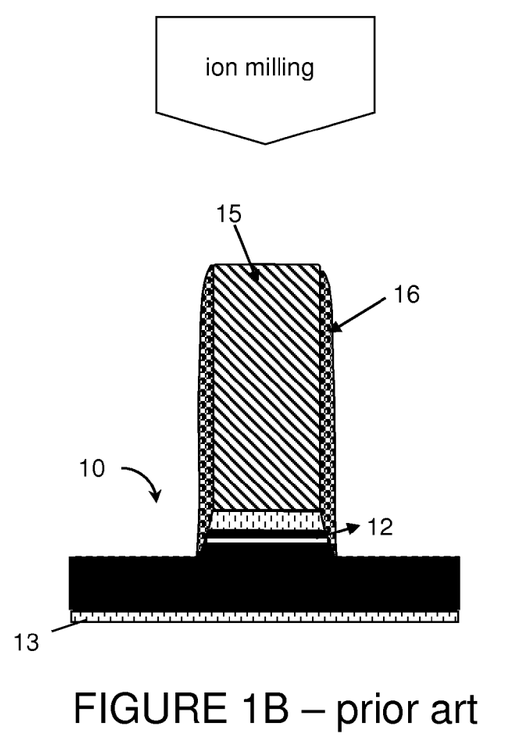

Nowadays, the use of magnetic layers for micro- and nano-devices gains lots of interest for many applications, such as for example MRAM memories, spin torque oscillators, hard disk read heads and sensor applications, and even magnetic logic circuits. An important problem occurring during processing of such devices is the patterning of the magnetic layers. Magnetic devices typically comprise multilayers of ultrathin magnetic and non-magnetic layers. Reactive etching of such multilayers is difficult, because of the variation in materials, which requires different etchants for different materials. Therefore, the patterning of such multilayer stacks is done typically using Reactive Ion Etching (RIE) or ion milling techniques. A drawback of these techniques is the redeposition of a mixture of all etched materials during patterning of the layers. In case of magnetic layers or conductive layers in general, this redeposition consists of conductive material, causing an electrical shortcut of the etched stack, due to this conductive sidewall deposition, as illustrated in FIGS. 1A and 1B. FIG. 1A illustrates a magnetic stack before ion milling. The magnetic stack 10 comprises two magnetic layers 11, separated by an insulating layer 12, e.g. a thin oxide layer, a conductive, e.g. metal, bottom electrode 13 and a conductive, e.g. metal, top electrode 14. When the magnetic stack 10 needs to be patterned, a suitably patterned resist layer 15 is provided. FIG. 1B illustrates the magnetic stack 10 after ion milling. It can be seen that during ion milling a conductive polymer 16 is deposited at the sidewalls of the resist 15, the magnetic layers 11 and the insulating layer 12. As the sidewalls of the magnetic layers 11 and the insulating layer 12 are covered with this conductive polymer 16, the magnetic layers 11 are short-circuited. Obviously, this unwanted electrical shortcut will lead to complete malfunctioning of the final device.

Figure 2A:
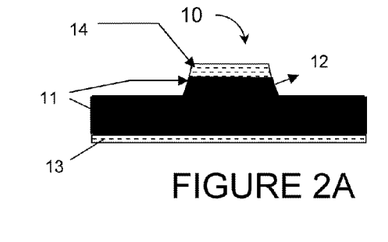
Figure 2B:
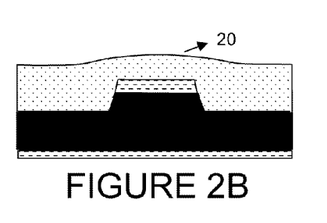
Figure 2C:
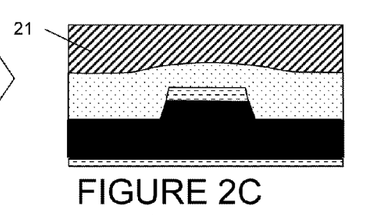
Figure 2D:
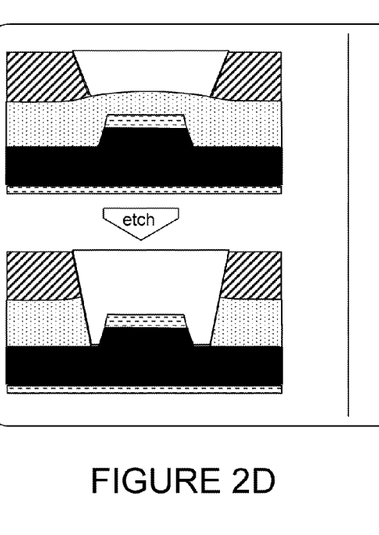
FIG. 2D illustrates the problem of mis-alignment using standard lithographic patterning having limited resolution and extreme good alignment thereby resulting in an oversized opening and hence wrong electrical contact and shortcuts.
Figure 2E:
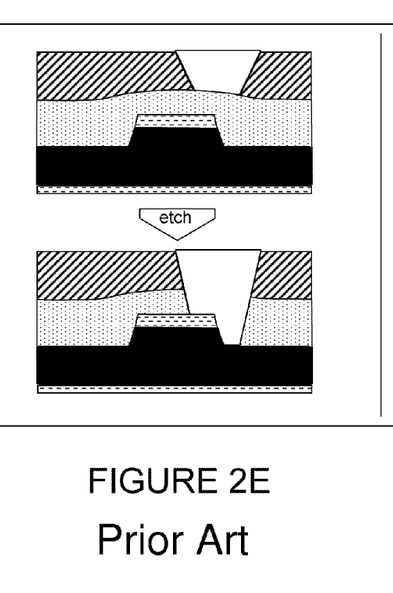
FIG. 2E illustrates the problem of mis-alignment using standard lithographic patterning having extreme good resolution but wrong alignment thereby resulting in a wrongly aligned electrical contact and shortcuts.
Figure 2F:
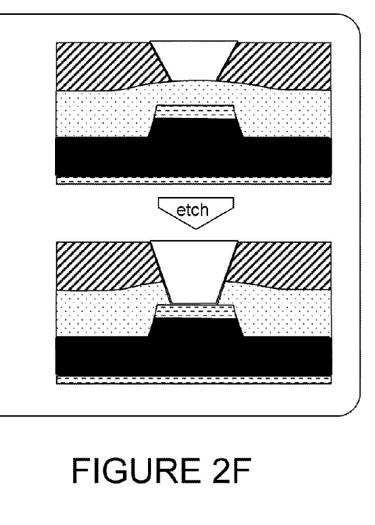
FIG. 2F illustrates lithographic patterning using very advanced lithographic patterning leading to good resolution and alignment and hence to a correct electrical contact.

A second problem during fabrication of such magnetic devices with small dimensions, e.g. in the nanometer range, is the alignment of the metallization to realize electrical contact with the patterned device. The conventional way (patterning of the stack 10—see FIG. 2A, oxide 20 deposition—see FIG. 2B, photoresist 21 deposition—see FIG. 2C, contact hole formation by litho and oxide 20 etch—see FIGS. 2D and 2E, and contact hole filling with metal) cannot be used, due to the very high resolution and alignment requirements for the lithographic patterning step. As can be seen from FIG. 2D, standard litho may have a limited resolution and an extreme good alignment, leading to a wrong electrical contact. In alternative embodiments, see FIG. 2E, standard litho may have an extreme good resolution but a considerable alignment error, which again leads to a wrong electrical contact. Insufficient resolution or inaccurate alignment will result again in a conductive shortcut of the devices, resulting again in complete malfunctioning of the final device (see FIGS. 2D, and 2E). Only very advanced litho has both an extreme good resolution and alignment, see FIG. 2F, which yields a correct electrical contact. However, very advanced litho puts a lot of severe constraints on the tools used and is not always available. Hence alternative approaches for this metallization step should be used.

Figure 3A:
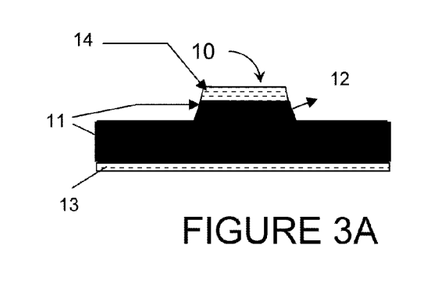
Figure 3B:
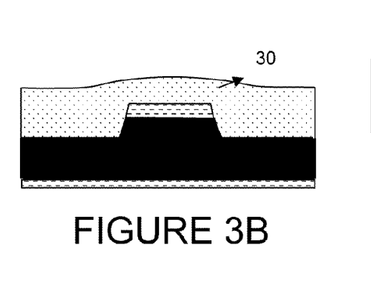
Figure 3C:
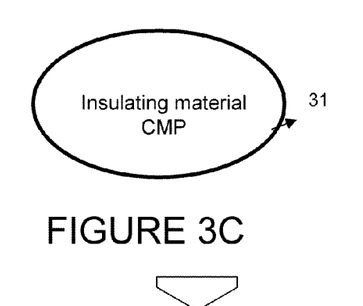
Figure 3D:
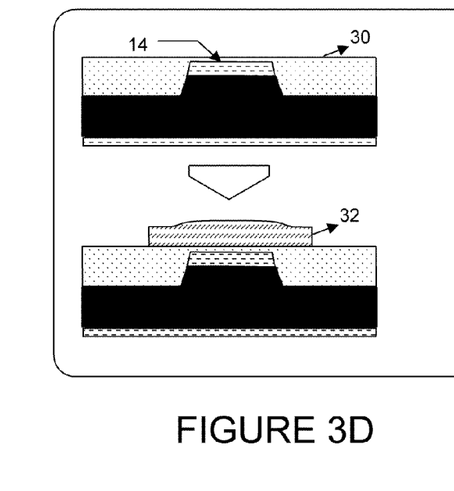
FIG. 3D illustrates the problem when a too short CMP steps is performed thereby leaving insulating material on top of the conductive electrode leading to no electrical contact and hence no functional device.
Figure 3E:
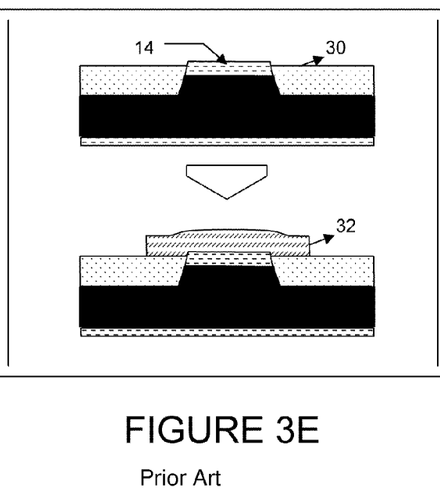
FIG. 3E illustrates a perfect CMP timing which is hardly possible to achieve leading towards a free top electrode and good electrical contact.
Figure 3F:
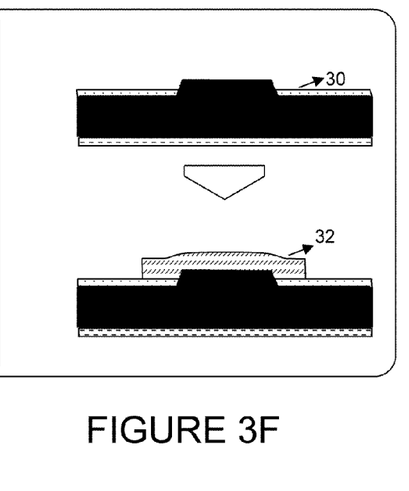
FIG. 3F illustrates the problem when a too long CMP step is performed thereby leading to magnetic structures with sidewalls which are not covered with insulation anymore and whereby the top of the magnetic device is removed resulting in a complete malfunctioning of the device.

An interesting process sequence for self-aligned electrical contact to a nanomagnetic device is illustrated in FIG. 3A to 3F. The sequence starts from a patterned magnetic stack 10 as for example illustrated in FIG. 3A, and comprises the use of insulating material, e.g. oxide 30 deposition—see FIG. 3B, followed by CMP—FIG. 3C, to create an insulating layer surrounding the magnetic devices. The insulating material CMP is applied to free the top metal electrode 14. The timing of the CMP is very critical, especially when the metal layer of the top electrode 14 is thin (and a thicker metal layer results in more sidewall deposition as illustrated with respect to FIG. 1B). After this CMP process step 31, a metal layer 32 is deposited, which is patterned by lithography and etch. In the latter case, the litho step is not critical: large metal patterns can be made, and alignment is not critical, since the underlying magnetic device is completely surrounded by insulating oxide (see FIGS. 3D, 3E, and 3F). Important issue however is the oxide CMP 31 process. Not only the selectivity of the CMP process towards the various exposed materials should be optimized, but especially the timing if this CMP process is critical: over-polishing (CMP time too long) leads to either a removal of insulation around the device, so that sidewalls of magnetic layers 11 are not covered with insulation anymore, resulting again in a shortcut, or to removal of the top part device itself which in both case would lead to complete malfunctioning devices—see FIG. 3F. If the CMP step is too short, as illustrated in FIG. 3D, the top metal electrode 14 is still covered with insulating material 30 when the CMP stops, preventing any electrical contact of the metal layer 32 with the magnetic device. Hence no functional device is obtained. To obtain a successful CMP process, not only the CMP timing has to be perfect, as illustrated in FIG. 3E, but also the top metal electrode 14 has to be thick enough, leading to a more problematic patterning and redeposition problem.

One method used in the state of the art to solve the redeposition issue is the step of removing the redeposition after the patterning step using a second etching step by putting the wafer under an angle to the ion beam 'skewed ion beam etching'. The disadvantage of this method is that skewed etching is a rather complex experimental technique not transferable to standard CMOS processing. Moreover there is still the issue of alignment and need for a controlled CMP process.

US20070166840 (US'840) describes a method for forming magnetic tunnel junctions in integrated circuits wherein sidewall spacer features are formed during the processing of the film stack. These sidewall spacer features create a tapered masking feature which helps to avoid byproduct redeposition during the etching of the film stack. However the disadvantage of this method is that the requirements for patterning (need for advanced lithographic techniques to realize alignment of top contact) remains and the fact that the spacers create a significant increase in dimensions.

US'840 discloses a method to solve the problem of redeposition but does not solve the alignment problem. Furthermore US'840 requires much smaller photoresist mask dimensions and results in a much weaker CD (critical Dimension) control.

Hence there still exists a problem to pattern a stack of magnetic layers thereby eliminating the above mentioned alignment problems thereby avoiding the need of very advanced lithography. Furthermore it is still desirable to facilitate the above mentioned oxide CMP process drastically such that the timing of the oxide CMP process is easier to control and without the risk of damaging the device or the surrounding insulating layer.

SUMMARY OF THE INVENTION

It is an object of embodiments of the present invention to provide a method for patterning of magnetic layers, more specifically the patterning of magnetic multilayers, which overcomes the problems mentioned above. Said patterning of magnetic multilayers may be so as to create magnetic tunnel junctions, having a barrier (insulating) layer such as for example a MgO layer in between the magnetic multilayers to create high tunnel magneto resistance (TMR) values. In said magnetic tunnel junctions, the electrons tunnel through said thin insulating barrier layer from one magnetic material (layer) to another magnetic material (layer).

Embodiments of the present invention circumvent the problem of redeposition of magnetic material during patterning (ion milling) of the magnetic multilayers resulting in a non-functional device due to shortcuts. Using embodiments of the method of the present invention it is possible to reduce the influence of the redeposition of magnetic material caused by ion milling, and limit it to a harmless location (straight sidewalls of a sacrificial layer) such that electrical shortcuts of the actual active device layers are avoided. Secondly, embodiments of the present invention drastically facilitate the insulating material, e.g. oxide, planarization, e.g. CMP, process used to planarize the insulating material surrounding the patterned stack of magnetic multilayers such that the timing of this planarisation process is easier to control. Furthermore embodiments of the present invention eliminate alignment problems thereby avoiding the need of very advanced lithography. This is achieved by developing a special lithographic process according to embodiments of the present invention, thereby using a sacrificial layer underneath the photoresist layer. By careful optimization of this process it addresses one or more of the problems described above: the redeposition (during patterning of the magnetic layers) is limited to a harmless location or is even completely alleviated, the insulating material, e.g. oxide, CMP process is facilitated drastically due to the height of the sacrificial layer, which is still present during the oxide CMP process such that the timing of the oxide CMP process is now easy to control without the risk of damaging the device or the surrounding insulating layer and the alignment problem in lithographic patterning steps is reduced or eliminated.

In a first aspect, a method according to embodiments of the present invention provides a lithographic process in which a first sacrificial layer is used underneath a second sacrificial layer, e.g. a photoresist layer, in order to pattern the magnetic layers and to overcome the problems mentioned above.

A method according to embodiments of the present invention comprises providing a magnetic stack comprising a magnetic layer sub-stack comprising magnetic layers and a bottom conductive electrode and a top conductive electrode electrically connecting the magnetic layer sub-stack at opposite sides thereof; providing a sacrificial pillar on top of the magnetic stack, the sacrificial pillar having an undercut with respect to an overlying second sacrificial material and a sloped foot with increasing cross-sectional dimension towards the magnetic stack, using the sacrificial pillar for patterning the magnetic stack, depositing an insulating layer around the sacrificial pillar, selectively removing the sacrificial pillar, thus creating a contact hole towards the patterned magnetic stack, and filling the contact hole with electrically conductive material.

The sloped foot of the sacrificial pillar causes a feature to be etched later on in the magnetic sub-stack to be slightly larger. The sloped wall of the sacrificial pillar mimics etching under an angle, and any material which would be redeposited on the sloped planes will be re-etched immediately afterwards. It is a further advantage of methods according to embodiments of the present invention that self alignment of the electrically conductive material and the magnetic stack takes place.

In particular embodiments, the first sacrificial layer is non-conductive. After applying both first and second sacrificial layers, a patterning step, e.g. lithographic patterning step, is used to pattern the second sacrificial layer. Subsequently, the first sacrificial layer is etched using the second sacrificial layer as an etch mask. By careful control of this etch process (e.g. by adapting the etch parameters such as the gas mixture, the pressure in the chamber, the etching time, ... ), the profile of the sidewall of the etched first sacrificial layer can be tuned to create both an undercut at the upper part of the patterned first sacrificial layer (close to the second sacrificial layer) and a sloped bottom part (foot) resulting in a final dimension of the patterned first sacrificial layer being smaller than the pattern of the second sacrificial layer. For a mask dimension of 50 nm, said undercut may be in the range of 5 nm up to 15 nm leading to an upper part of patterned first sacrificial layer having a diameter in the range between 40 nm and 20 nm. The bottom part of the patterned first sacrificial layer may have a sloped profile or foot such that the bottom of the patterned first sacrificial layer achieves a diameter equal to or approaching the original diameter of the mask, in the example given 50 nm. The slope of said foot may be in the range of 30 up to 50 degrees.

The choice of the first sacrificial layer as a non-conductive material, the undercut and the profile are important parameters in controlling the CD (critical dimension) and in avoiding redeposition during the following ion milling step(s) in order to pattern the magnetic layers. By creating said undercut and sloped profile the redeposition is initially limited, except for a fraction thereof which gets immediately re-etched, to straight parts of the sidewalls of the first sacrificial layer. The sloped sidewalls of the sacrificial pillar will not be covered by redeposited material (due to immediate re-etching) and hence will prevent that the sidewalls of the magnetic device are covered by conductive redeposited material Furthermore said undercut in the first sacrificial layer prevents that redeposition results in an increase in lateral dimensions of the masking material.

In a second aspect, embodiments of the present invention provide a method to realise the final metallization step and alignment in order to realize electrical contact with the magnetic devices. First, an insulting layer (e.g. oxide) is deposited onto the patterned magnetic layers, followed by a planarization step, e.g. a chemical mechanical polishing step (CMP), to create an insulating layer surrounding the devices. The planarization step may be such that the insulating layer is planarised below the level of the second sacrificial layer, thereby leaving a significant portion of the patterned first sacrificial layer.

In a next step an electrically conductive layer, e.g. a metal layer, is deposited, which may be patterned by lithographic patterning and etching. Using this method, in combination with the lithographic process according to embodiments of the first aspect of the present invention described above to create both an undercut at the top and a sloped profile, the timing of a planarising method such as CMP is less critical and can be stopped anywhere over the total height of the first sacrificial layer. After applying the planarisation step, a plug (pillar) made from this first sacrificial layer is covering each magnetic device. This first sacrificial layer is then selectively etched away, while maintaining the surrounding insulating layer unaffected. Hence a very small, nice, clean contact hole is formed in the insulating layer, perfectly aligned to each underlying magnetic device due to the self-alignment inherent at this process. These contact holes may then be filled during the following step of providing electrically conductive material, e.g. metallization step, and by an easy lithographic patterning and etching step, this electrically conductive layer may be patterned. This last lithographic patterning step is a simple process step, since resolution and alignment requirements are limited.

Furthermore, embodiments of the present invention relate to the fabrication of magnetic devices as used for example in MRAM memories, spin torque oscillators, hard disk read heads, sensor applications and even magnetic logic circuits, said fabrication method making use of a method according to embodiments of the present invention for patterning the magnetic layers.

Particular and preferred aspects of the present invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

The figures are intended to illustrate some aspects and illustrative embodiments of the present invention. The figures are depicted in a simplified way for reason of clarity. Not all alternatives and options are shown and therefore the invention is not limited to the content of the given drawings. Like numerals are employed to reference like parts in the different figures.

FIGS. 2A to 2F illustrate the problems in prior art occurring during the patterning and final metallization step.

FIGS. 3A to 3F illustrate the problem in prior art for contacting magnetic devices using oxide CMP followed by metal patterning.

FIGS. 4A to 4C illustrate the controlled sidewall deposition according to embodiments of the invention showing clearly that the undercut and sloped profile of the sacrificial layer are beneficial and lead to controlled deposition without foot coverage.

FIGS. 5A-5C illustrate SEM images corresponding to the schematic FIGS. 4A-4C illustrating the controlled sidewall deposition according to embodiments of the invention.

FIGS. 8A to 8E illustrate processing steps after oxide deposition in order to contact the magnetic devices in accordance with embodiments of the present invention.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the illustrative embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The invention will now be described by a detailed description of several embodiments. It is clear that other embodiments can be configured according to the knowledge of persons skilled in the art without departing from the technical teaching of the invention as defined by the appended claims.

The term ion milling or ion beam etching is a technique based on removal of atoms by sputtering with an inert gas. Throughout the description this technique is used to pattern the stack of magnetic multilayers. Instead of ion milling, another process which is unselective towards different materials could be used.

In accordance with embodiments of the present invention, a method is provided for patterning and electrically contacting of magnetic layers, more specifically the patterning of magnetic layers making use of a combination of photolithographic patterning, reactive ion etching, ion milling and chemical mechanical polishing (CMP).

The method according to embodiments of the invention aims at patterning magnetic devices without undesired redeposition of magnetic material onto critical areas of the device during the patterning (ion milling) as well as simplifying the processing thereby resulting in more relaxed processing accuracy requirements due to a wider process window.

Embodiments of the invention solve the problem of redeposition of magnetic material during patterning (ion milling) of the magnetic stack, also called magnetic multilayers, resulting in a non-functional device due to shortcuts. Because of the complexity of the multilayers (a wide range of different materials) and the small thickness of the layers (in a range from 1 nm to 10 nm) it is not easy to pattern said stack of magnetic layers using reactive ion etching whereby during etching a volatile compound is formed which is removed to avoid redeposition. Ion milling or sputter etching is a particularly useful method to pattern said magnetic multilayers. However said ion milling technique bombards the substrate with high energetic ions (e.g. of noble gases, often $Ar^+$) which knock atoms from the substrate which then redeposit on unwanted substrate (device) areas. Because these redepositions are composed of a mixture of all sputtered materials, it is hardly possible to selectively remove these redepositions afterwards by e.g. a selective wet etch. Using the method according to embodiments of the invention, however, it is possible to eliminate, or at least limit the redeposition of magnetic material caused by ion milling to a harmless location (straight sidewalls of sacrificial layer), such that electrical shortcuts of the actual active device layers are avoided.

Furthermore, embodiments of the present invention facilitate the oxide Chemical Mechanical Planarizing/Polishing (CMP) process used to planarize the insulating material surrounding the patterned stack of magnetic multilayers drastically such that the timing of this oxide CMP process is easier to control.

The above described problems are solved by embodiment of the present invention by developing a special bilayer lithographic process thereby using a sacrificial layer underneath the photoresist. By careful optimization of this process it addresses both problems described above: the redeposition (during patterning of the magnetic layers) is limited to a harmless location and the oxide CMP process is facilitated drastically due to the height of the sacrificial layer, which is still present during the oxide CMP process such that the timing of the oxide CMP process is now easy to control without the risk of damaging the device or the surrounding insulating layer.

It is further an advantage of the method according to embodiments of the present invention to avoid at least the use of very advanced and expensive lithographic patterning techniques.

A method for patterning and electrically contacting a magnetic stack according to embodiments of the present invention may comprise at least the following steps:

providing a magnetic stack comprising a magnetic layer sub-stack comprising magnetic layers, and a bottom conductive electrode and a top conductive electrode electrically connecting the magnetic layer sub-stack at opposite sides thereof;

providing a sacrificial pillar on top of the magnetic stack, the sacrificial pillar having an undercut with respect to an overlying second sacrificial material and a sloped foot with increasing cross-sectional dimension towards the magnetic stack, using the sacrificial pillar for patterning the magnetic stack, thereafter depositing an insulating layer around the sacrificial pillar, thereafter selectively removing the sacrificial pillar, thus creating a contact hole towards the patterned magnetic stack, and filling the contact hole with electrically conductive material.

According to particular embodiments, the method of the invention for patterning magnetic devices and contacting said magnetic devices may comprise at least the steps of Providing a magnetic stack comprising magnetic layers thus forming a magnetic multilayer sub-stack, said magnetic stack having a bottom metal layer underneath and a top metal layer above said magnetic multilayer sub-stack, then Depositing a first sacrificial layer, then Depositing a second sacrificial layer, for example a photolithographic layer, Patterning, for example lithographically patterning, said second sacrificial layer, Patterning said first sacrificial layer using the patterned second sacrificial layer as an etch mask such that the profile of the sidewall of the first sacrificial layer contains an undercut at the top underneath the lithographic mask and a sloped profile towards the bottom close to the magnetic stack, Ion milling said top metal layer and at least some of the magnetic layers of the magnetic stack to create a magnetic pillar thereby redepositing part of the magnetic material onto the sloped sidewalls of the patterned first sacrificial layer but not onto the magnetic layers, then Depositing an insulting layer at least around the patterned first sacrificial layer, then Planarizing said insulating layer below the level of the mask formed by the second sacrificial layer, thereby leaving a significant portion of the patterned first sacrificial layer, Selectively removing the first sacrificial layer to create a contact hole, and then Depositing a layer of conductive material onto the remaining insulting layer thereby filling said contact hole completely with electrically conductive material, e.g. metal, and Patterning said layer of conductive material such that individual electrically contactable magnetic devices may be created that are electrically insulated from each other.

Figure 4A:
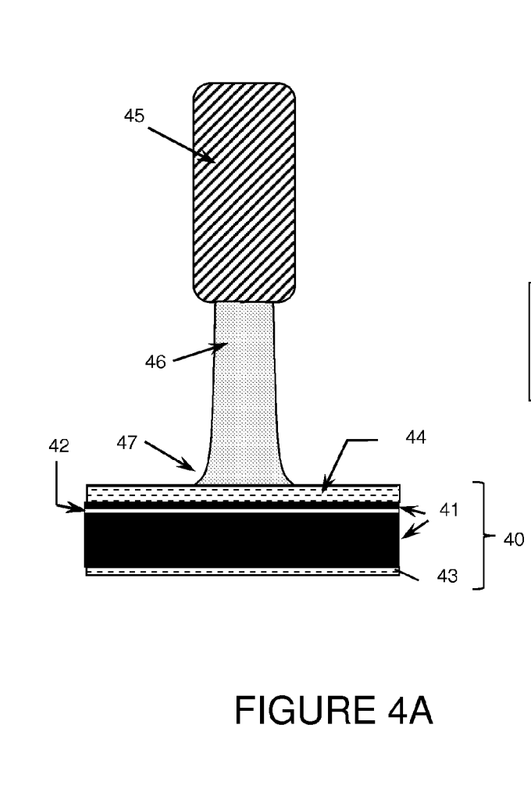
FIG. 4A illustrates the patterned lithographic and sacrificial layer before ion milling.
Figure 4B:
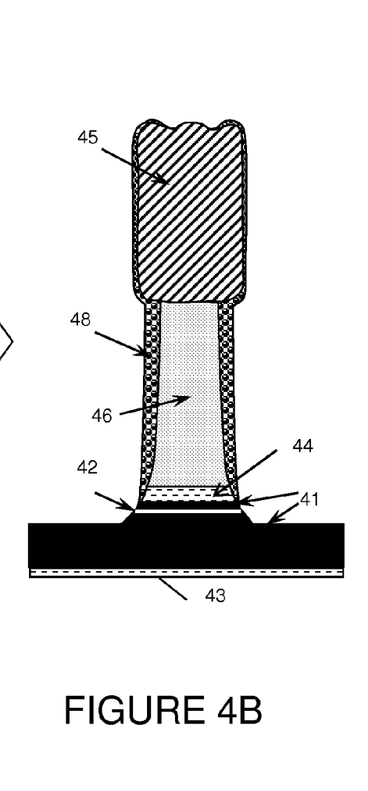
FIG. 4B illustrates the patterned lithographic and sacrificial layer after 2 minutes ion milling resulting in controlled sidewall deposition.
Figure 4C:
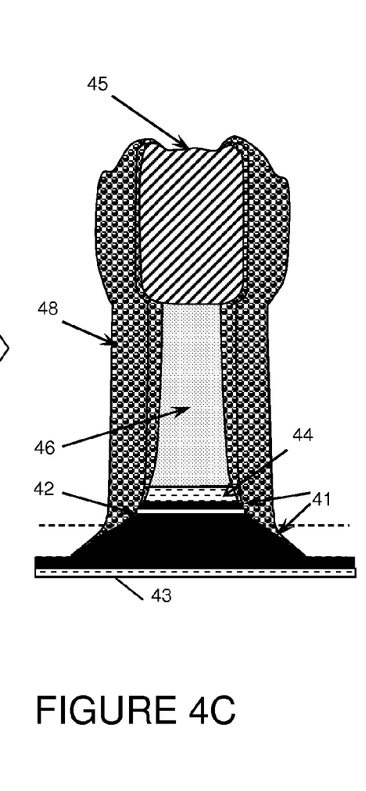
FIG. 4C illustrates the patterned lithographic and sacrificial layer after 4 minutes ion milling resulting in too much sidewall deposition because for obtaining a fully functional device no deposition of conductive material is allowed onto the magnetic layers.

A first part of a method according to embodiments of the present invention is illustrated in FIGS. 4A to 4C. These drawings illustrate the controlled sidewall deposition according to embodiments of the invention, showing clearly that the undercut and sloped profile of the sacrificial layer are beneficial and lead to controlled deposition without foot coverage.

According to embodiments of the present invention, a magnetic stack 40 is provided. In the embodiment illustrated, the magnetic stack 40 comprises a magnetic sub-stack comprising two magnetic layers 41 separated by an insulating layer 42, e.g. a thin oxide layer. The magnetic stack furthermore comprises a conductive bottom electrode 43 and a conductive top electrode 44.

According to embodiments, said stack 40 of magnetic layers may comprise magnetic layers selected from a wide range of materials exhibiting magnetic properties such as Co, Fe, Ni, CoFe, CoFeB, NiFe, IrMn, PtMn, . . . . The thickness of each of the layers is in a range from 1 nm to 10 nm. Said different magnetic layers may be deposited using sputtering techniques (Physical Vapor Deposition (PVD)).

According to embodiments, said stack 40 of magnetic layers further comprises an insulating layer 42 such as a thin oxide layer. An example of a suitable oxide layer is MgO. The thickness of said oxide layer depends on the application and may for example be in the order of 1 nm.

According to embodiments, a possible stack 40 comprising magnetic multilayers used to fabricate magnetic devices may comprise one or more of the following layers: Ta, CoFeB, MgO, CoFeB, Ru, CoFe, InMn, FeCuN, Ta, Pt. The thickness of the layers may be in a range from 1 nm to 10 nm. The deposition methods used to deposit said layers may be sputtering.

According to embodiments, said conductive bottom electrode and the conductive top electrode may be made of metal. Examples of suitable metals to be used as metal layer are Au and Cu but any electrically conductive material suitable to act as an electrode can be used.

On top of the magnetic stack 40, in order to pattern this stack 40 and provide electrical contacts, a first sacrificial layer is provided.

According to embodiments, said first sacrificial layer is such that it fulfils the criteria of being a good insulator, rigid enough to carry a second sacrificial layer, e.g. a resist layer at nm sizes, etchable by RIE, removable after CMP and insensitive to e-beam exposure. Examples of suitable sacrificial materials are resist type materials such as a BARC (Bottom anti reflective coating) or BARLi (bottom antireflective layer coating) layer. BARC is rather insensitive to e-beam exposure and is very etchable with respect to an e-beam sensitive resist on top. The thickness of said first sacrificial layer may be at least 100 nm and up to 500 nm.

On top of the first sacrificial layer, a second sacrificial layer is provided, which may for example be a photographic layer, for example a photoresist layer. The second sacrificial layer is patterned, for example may be lithographically patterned. This way, a patterned second sacrificial layer 45 is provided, which will be used as a mask for patterning the first sacrificial layer underneath it.

The mask formed by the patterned second sacrificial layer 45 is then used as an etch mask for patterning the first sacrificial layer. According to embodiments, the step of patterning said first sacrificial layer may be performed using anisotropical reactive ion etching which is tuned in order to achieve an undercut at the top underneath the mask and a sloped profile towards the bottom. Said tuning may be achieved by a careful optimization of directionality of the etchant, e.g. plasma, versus the chemical composition of the etchant, e.g. reactive ion plasma.

The result of the etching process for etching the first sacrificial layer is such that a pillar 46 is formed. After etching, the remaining upper part of the pillar 46 has a smaller width than the mask formed by the patterned second sacrificial layer 45, and a sloped bottom part (foot) 47 which has a width substantially equal to the width of the mask 45. For obtaining this, a first sacrificial layer may be used that can be etched in a selective way with respect to the second sacrificial layer on top. Furthermore, the etch can be controlled so that an underetch appears which is not too much. In other words, specifically selected sacrificial layers may be combined with a specifically selected RIE etch in order to obtain the desired result. A person skilled in the art knows sacrificial materials and etch chemistries which lead to the desired result.

FIG. 4A illustrates the patterned first and second sacrificial layers before ion milling.

Once the pillar 46 with its particular shape (undercut with respect to mask and sloped bottom profile) is provided, removal of material from the stack 40 may be carried out, for example by ion milling. According to embodiments of the present invention, said ion milling step or ion beam etching technique may be performed using atoms such as Ar or Xe for the bombardment. The time of the ion milling step (tool dependent) has to be such that no redeposition is occurring at the side of the insulating layer 42, e.g. a thin oxide barrier layer, and at the sidewalls of the patterned magnetic layers 41 below said insulating layer 42. The time of the ion milling step may also be optimized to stop exactly in the insulating layer 42.

FIG. 4B illustrates the patterned first and second sacrificial layers 46, 45 after 2 minutes of ion milling for removing material from the magnetic stack 40 not covered by the pillar 46. The ion milling process results in controlled sidewall deposition of conductive and magnetic material 48 onto the pillar 46 and the mask 45. As can be seen from FIG. 4B, if the ion milling process does not last too long (time dependent on the exact configuration of the pillar 46, in particular the slope of the foot 47, and the magnetic stack 40, in particular the thickness of the top electrode 44), the redeposited conductive and magnetic materials 48 do not short circuit the magnetic layers 41.

FIG. 4C illustrates the patterned first and second sacrificial layers 46, 45 after 4 minutes of ion milling for removing material from the magnetic stack 40 not covered by the pillar 46, resulting in too much sidewall deposition 48 because for obtaining a fully functional device no deposition of conductive material is allowed onto the magnetic layers 41.

Figure 5A:
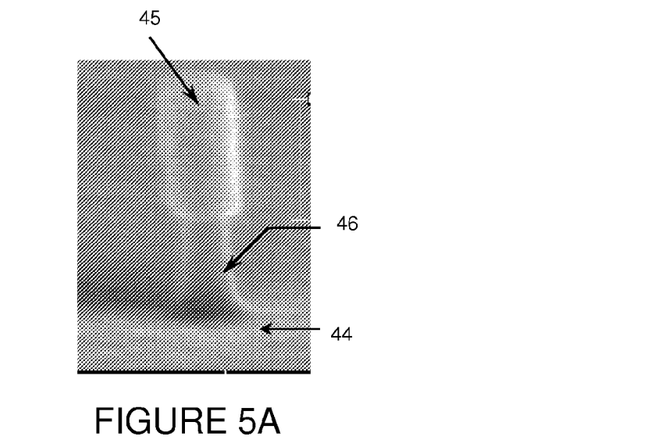
FIG. 5A (corresponding to FIG. 4A) illustrates the patterned lithographic and sacrificial layer before ion milling.
Figure 5B:
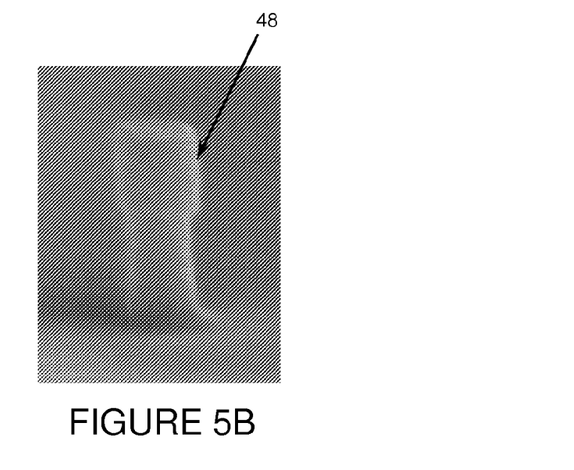
FIG. 5B (corresponding to FIG. 4B) illustrates the patterned lithographic and sacrificial layer after 2 minutes ion milling.
Figure 5C:
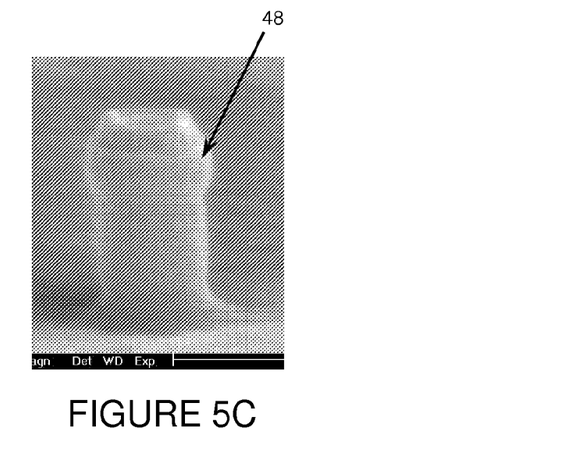
FIG. 5C (corresponding to FIG. 4C) illustrates the patterned lithographic and sacrificial layer after 4 minutes ion milling.

FIGS. 5A-5C illustrate SEM images corresponding to the schematic FIGS. 4A-4C illustrating the controlled sidewall deposition according to embodiments of the invention. FIG. 5A (corresponding to FIG. 4A) illustrates the patterned first and second sacrificial layers 46, 45 and before ion milling. FIG. 5B (corresponding to FIG. 4B) illustrates the patterned first and second sacrificial layers 46, 45 after 2 minutes of ion milling. FIG. 5C (corresponding to FIG. 4C) illustrates the patterned first and second sacrificial layers 46, 45 after 4 minutes of ion milling.

Figure 6A:
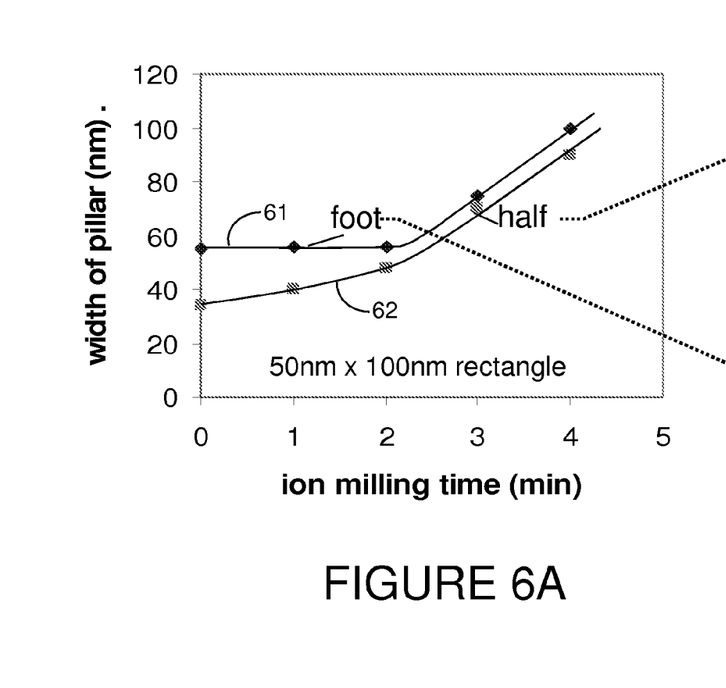
FIG. 6A illustrates sidewall deposition in accordance with embodiments of the present invention (expressed as width of the sacrificial layer pillar in nm) in function of the ion milling time. A corresponding etched pillar and sidewall deposition in accordance with embodiments of the present invention is illustrated in FIG. 6B for a 2 minutes ion milling process. It is further clear that the optimum ion milling time may not exceed 2 minutes to avoid sidewall deposition on crucial positions of the magnetic device (due to shape of sacrificial layer).
Figure 6B:
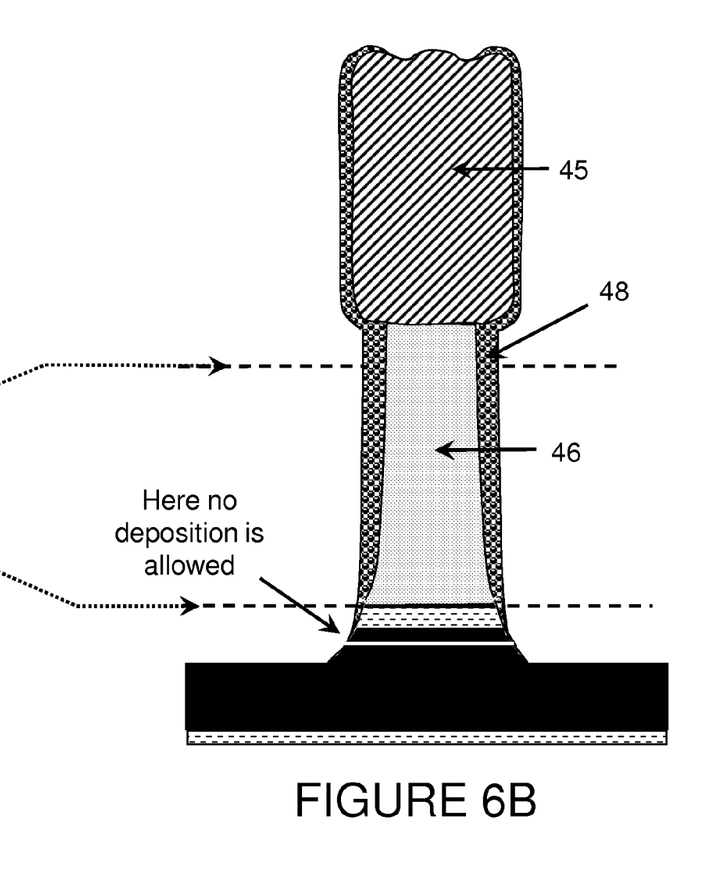

FIG. 6A illustrates the sidewall redeposition of magnetic/conductive material 48 during ion milling (expressed as width of the pillar 46 in nm) in function of the ion milling time. The corresponding etched pillar 46 and sidewall deposition 48 is illustrated for a close to optimal ion milling process in FIG. 6B. FIG. 6A shows two graphs: graph 61 illustrating the total width of the pillar 46 with sidewall deposition 48 over ion milling time at the level of the bottom of the pillar 46, and graph 62 illustrating the total width of the pillar 46 with sidewall deposition 48 over ion milling time at the level of an upper part of the pillar 46. It can be seen that for a certain time period (2 minutes in the embodiment illustrated), material is redeposited on the sidewalls of the pillar 46 but substantially not on the sloped foot 47. It is further clear that the optimum ion milling time should not be exceeded (for the shown tool set up not exceeding 2 minutes) to avoid sidewall deposition 48 on crucial positions of the magnetic device (due to shape of sacrificial layer).

Figure 7:
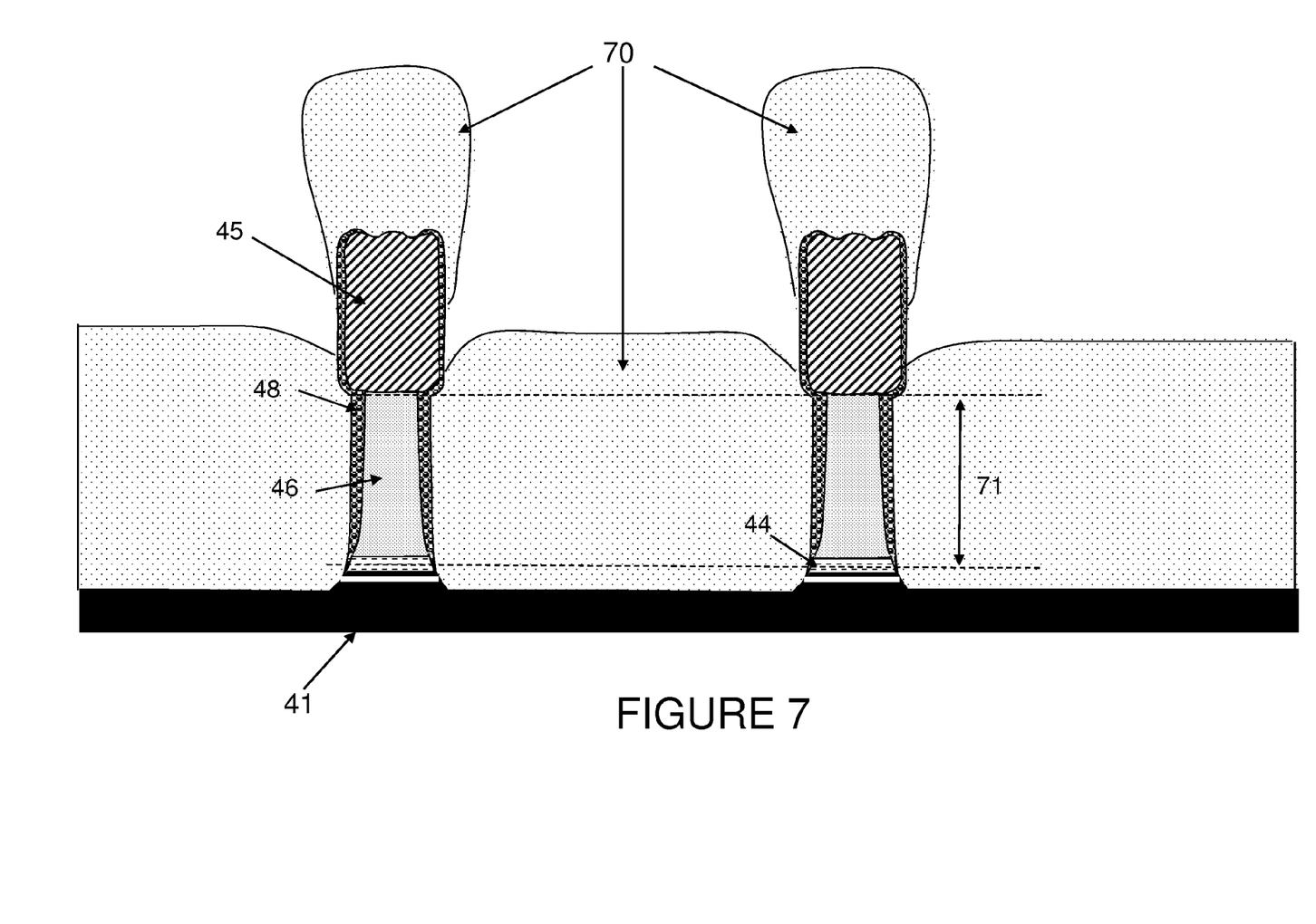
FIG. 7 illustrates insulating material (oxide) deposition onto the patterned magnetic layers to create an insulating (oxide) layer surrounding the devices.

After ion beam milling, an insulating layer 70 may be applied over the structure. According to embodiments of the present invention, said insulting layer 70 may be an oxide layer. FIG. 7 illustrates oxide deposition onto the patterned magnetic layers to create an insulating (oxide) layer surrounding the magnetic devices formed by patterning the magnetic stack 40, and the pillars 46 on top thereof.

In a next step, the insulating layer 70 may be planarized, for example by a mechanical planarization step. One possibility for planarizing the insulating layer may be cutting, for example fly cutting. According to alternative embodiments the step of planarizing said insulating layer 70 may be performed using chemical mechanical polishing. The planarization has to be such that a significant portion of the patterned first sacrificial layer 46 is left above the magnetic structure and such that enough insulating material 70 is left on the sidewalls of the patterned magnetic stack (device). Nevertheless, enough insulating material 70 needs to be removed so that at least the mask 45 is removed with it, so as to free sacrificial material of the pillar 46. A possible process window for the planarization, e.g. CMP process window, is illustrated by reference 71 in FIG. 7.

Figure 8A:
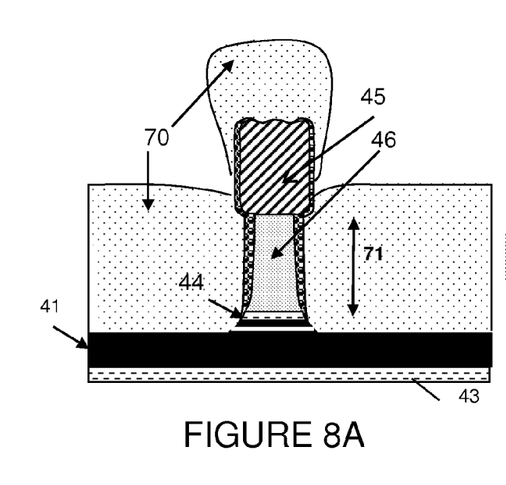
FIG. 8A illustrates the patterned pillar according to embodiments of the invention after subsequent oxide deposition.
Figure 8B:
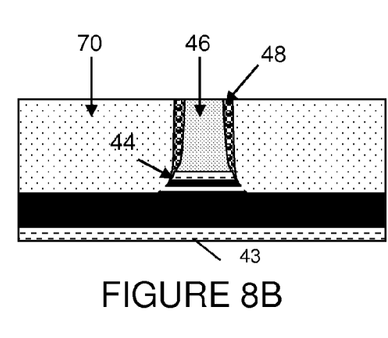
FIG. 8B illustrates the structure after planarizing the oxide layer using chemical mechanical polishing (CMP).

FIG. 8A to FIG. 8E illustrate the processing steps as from oxide deposition, carried out in order to contact the magnetic devices. FIG. 8A illustrates a device in a state as also illustrated in FIG. 7. The state of the device after the planarization step is illustrated in FIG. 8B: at least the mask 45 is removed in such a way that a surface of the pillar 46 is freed.

Figure 8C:
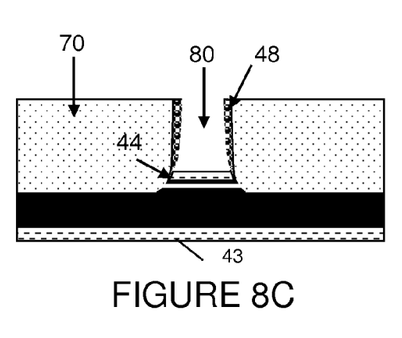
FIG. 8C illustrates the structure after the selective removal of sacrificial material to create a contact hole towards the magnetic device.

Thereafter, the remaining material of the first sacrificial material in the pillar 46 is selectively removed, as illustrated in FIG. 8C. According to embodiments of the present invention, the step of selectively removing the sacrificial layer 46 to create a contact hole may be performed using a selective dry etching step e.g. in case the sacrificial material is a BARC layer, a Reactive Ion Etching (RIE) step using an $O_2$ and Ar based plasma may be used to remove the sacrificial material out of the pillar 46, thus forming a contact hole 80. RIE is very convenient because it is selective and hence is not critical. However said selective removal process is dependent on the type of first sacrificial material used, meaning that the etching parameters need to be adapted to match the chosen first sacrificial material.

Figure 8D:
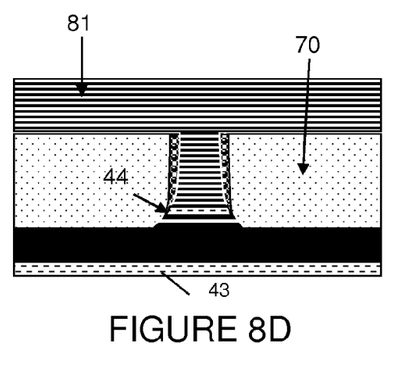
FIG. 8D illustrates the structure after deposition of a metal layer in contact hole (metallization) and FIG. 8E illustrates the final device after lithographic patterning, metal etching and resist strip.

Thereafter, as illustrated in FIG. 8D, the contact hole 80 is filled with electrically conductive material 81. This may be done by providing, e.g. depositing, a layer of electrically conductive material all over the remaining portions of the insulating layer 70, thus at the same time filling the contact hole 80. The electrically conductive material may be metal. According to embodiments of the present invention, said metal layer used to deposit in the contact hole and onto the remaining insulting layer may be selected from metals having a good conductivity such as Au and Cu.

In the above description, the processing is described with reference to manufacturing of a single electrically contactable magnetic device. It will be clear for a person skilled in the art that the same processing can be used for simultaneously manufacturing a plurality of such devices, e.g. an array of such devices. In order to make the devices separately contactable (electrically insulated from one another), according to embodiments of the present invention, the layer of electrically conductive material may be patterned. The patterning of the layer of electrically conductive material, e.g. metal layer, used to contact the magnetic devices may be performed using standard lithographic patterning, dry etching and resist stripping.

Figure 8E:
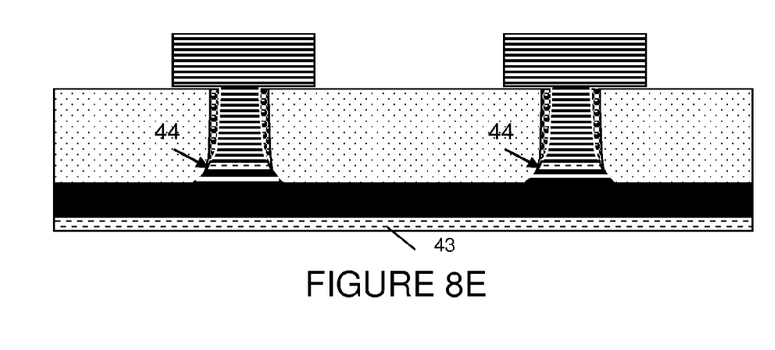

FIG. 8E illustrates final devices after lithographic patterning, metal etching and resist strip.

The method according to embodiments of the present invention may be used to fabricate magnetic devices for example as used in MRAM memories, spin torque oscillators, hard disk read heads and sensor applications, and even magnetic logic circuits in which typically a small current carrying magnetic device is used.

As an example, process steps of a method according to embodiments of the present invention as used during an experiment are given hereinbelow.

In a first step, deposition is performed of an MTJ stack on thermally oxidised SI—SiO2 wafers. The following stack is deposited: Ta 3/CuN 40/Ta 3/PtMn 20/CoFe 2/Ru 0.8/CoFeB 2/Mg 1.3+ox/CoFeB 3/Ta 8 (numbers are thicknesses in nm).

Thereafter, a standard wafer cleaning before processing is carried out.

In a next step, bottom contacts are defined by means of optical lithography and Ion beam etching, and devices are electrically separated.

Thereafter, a first layer of sacrificial material is provided, for example by spinning and baking the material, and a second layer of sacrificial material is provided, for example also by spinning and baking. Both layers are provided one on top of the other. In the second layer of sacrificial material, desired shapes are generated, to provide a mask for patterning the layer of first sacrificial material.

Once the mask is formed, an RIE etch of the first layer of sacrificial material is performed to get a pillar with a desired undercut and sloping. In the experiment, the parameters to obtain the desired pillar profile were as follows: O2+Ar recipe for 50" (RF power 30 W, ICP power 100 W, Ar 15 sccm, O2 10 sccm, press 20 Torr, 20 Deg, He back pressure 8 Torr, in oxford plasma lab etcher).

Thereafter, Ion beam etching was performed to define the nanopillars, i.e. to transfer of mask into the magnetic multilayer stack.

Devices were then passivated, for example by depositing 110 nm $SiO_2$.

The passivation layer is CMPed, by polishing to free the top contact to the pillar using SF1 polishing liquid to polish the $SiO_2$, and remove the remaining second sacrificial layer.

Vias were then created in the SiO2 to make contact to the bottom contact ("far" away from the pillars) by means of optical lithography and RIE etching.

Thereafter, the top electrode was created by means of optical lithography and sputter deposition.

It is to be understood that although particular embodiments, specific constructions and configurations, as well as materials, have been discussed herein for devices according to the present invention, various changes or modifications in form and detail may be made without departing from the scope of this invention as defined by the appended claims.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The invention claimed is:

1. A method for patterning and electrically contacting a magnetic stack, comprising:
    providing a magnetic stack comprising a magnetic layer sub-stack comprising at least one magnetic layer and a bottom conductive electrode and a top conductive electrode electrically connecting the magnetic layer sub-stack at opposite sides thereof, wherein the magnetic layer comprises a magnetic material;
    providing a sacrificial pillar on top of the magnetic stack, the sacrificial pillar having an undercut with respect to an overlying second sacrificial material and a sloped foot with increasing cross-sectional dimension towards the magnetic stack;
    using the sacrificial pillar for patterning the magnetic stack by patterning the top conductive electrode and the magnetic layer to create a magnetic pillar, whereby a part of the magnetic material is redeposited onto sloped sidewalls of a patterned first sacrificial layer but not onto the magnetic layer;
    depositing an insulating layer around the sacrificial pillar;
    planarizing the insulating layer below a level of the second sacrificial material, whereby a portion of the sacrificial pillar is left;
    selectively removing the sacrificial pillar, whereby a contact hole towards the patterned magnetic stack is created in the insulating layer; and
    filling the contact hole with an electrically conductive material.

2. The method of claim 1, wherein providing a sacrificial pillar comprises:
    providing a first sacrificial layer;
    providing a second sacrificial material over the first sacrificial layer;
    patterning the second sacrificial material;
    patterning the first sacrificial layer using the patterned second sacrificial material as a mask, whereby an undercut in the first sacrificial layer is created, such that a part of the patterned first sacrificial layer remote from the magnetic stack has a width smaller than a width of the mask, and such that a part of the patterned first sacrificial layer close to the magnetic stack has a sloped bottom part which, at an interface with the magnetic stack, has a width substantially equal to the width of the mask.

3. The method of claim 2, wherein patterning the first sacrificial layer comprises using anisotropic reactive ion etching with a reactive ion plasma to achieve an undercut at a top of the first sacrificial layer underneath the patterned second sacrificial material and a sloped profile towards a bottom of the first sacrificial layer, wherein patterning is achieved by selection of a directionality and a chemical composition of the reactive ion plasma.

4. The method of claim 1, wherein depositing an insulating layer around the sacrificial pillar comprises depositing an insulating layer around the sacrificial pillar surrounded by redeposited magnetic material.

5. The method of claim 1, further comprising patterning the electrically conductive material filling the contact hole.

6. The method of claim 1, wherein providing a magnetic stack comprises providing at least one magnetic layer selected from the group consisting of Co, Fe, Ni, CoFe, CoFeB, NiFe, IrMn, and PtMn.

7. The method of claim 1, wherein providing a magnetic stack further comprises providing an additional insulating layer.

8. The method of claim 7, wherein patterning the magnetic stack is stopped in the additional insulating layer.

9. The method of claim 1, wherein providing a magnetic stack comprises providing one or more magnetic multilayers selected from the group consisting of Ta, CoFeB, MgO, CoFeB, Ru, CoFe, InMn, FeCuN, and Ta.

10. The method of claim 1, wherein providing a magnetic stack comprises providing at least one magnetic layer having a thickness I of from 1 nm to 10 nm.

11. The method of claim 1, wherein patterning the magnetic stack comprises ion milling.

12. The method of claim 1, wherein providing a sacrificial pillar comprises providing a sacrificial pillar having a height of from 100 nm to 500 nm.

13. The method of claim 1, wherein planarizing the insulating layer comprises using chemical mechanical polishing.

14. The method of claim 1, wherein selectively removing the sacrificial pillar is performed using a selective dry etching step.

15. Use of the method of claim 1 in the fabrication of any of MRAM memories, hard disk read heads and sensors, spin torque oscillators, and magnetic logic devices.

16. A device comprising a patterned stack of magnetic layers formed by the method of claim 1.

* * * * *